United States Patent [19]
Durant

[11] Patent Number: 5,470,644
[45] Date of Patent: Nov. 28, 1995

[54] APPARATUS AND METHOD FOR FABRICATION OF PRINTED CIRCUIT BOARDS

[76] Inventor: David Durant, 6298 Drake St., Palm Beach Gardens, Fla. 33418

[21] Appl. No.: 230,748

[22] Filed: Apr. 21, 1994

[51] Int. Cl.$^6$ ..................................................... B32B 9/00
[52] U.S. Cl. ..................... 428/209; 428/901; 428/464; 156/233; 156/245; 156/246; 216/20
[58] Field of Search .................................. 428/209, 464, 428/901; 156/629, 902

[56] References Cited

U.S. PATENT DOCUMENTS

| | | | |
|---|---|---|---|
| 2,914,404 | 11/1959 | Fanselau et al. | 96/35 |
| 2,919,179 | 12/1959 | Van Wagner | 41/43 |
| 3,059,320 | 10/1962 | Seabury, III et al. | 29/155.5 |
| 4,682,415 | 7/1987 | Adell | 29/846 |
| 4,800,397 | 1/1989 | Afzali-Ardakani et al. | 346/1.1 |
| 4,935,090 | 6/1990 | Brower | 156/307.3 |
| 4,980,016 | 12/1990 | Tada et al. | 156/629 |
| 4,991,287 | 2/1991 | Platt et al. | 29/840 |
| 5,201,974 | 4/1993 | West | 156/47 |

OTHER PUBLICATIONS

Press-n-Peel, Owner's Manual, Not dated, pp. 1-2.
DynaArt Designs, Toner Transfer System, Not dated, pp. 1-4.

Primary Examiner—Patrick J. Ryan
Assistant Examiner—Kam Lee
Attorney, Agent, or Firm—John C. Smith

[57] ABSTRACT

A laminated sheet allows circuit boards to be fabricated without any special equipment. The laminated sheet can be printed using an ordinary laser printer on a personal computer. The sheet has a conductive layer, such as copper, attached to a nonconductive flexible substrate, such as Kapton. The outer surface of the copper is coated with an ink which provides a receiving surface for toner when the laminated sheet is fed through a printer. The other side of the flexible substrate is attached to a removable layer of paper which provides support for the laminated sheet during the printing process. The paper is removed after printing and the adhesive which held the paper is used to attach the flexible substrate to a rigid substrate. Alcohol is used to remove the ink and expose the copper for etching. The alcohol does not remove the toner which acts as a mask during the etching process. The toner is removed after board fabrication. An alignment procedure allows circuit land patterns to be placed on both sides of a circuit board.

6 Claims, 9 Drawing Sheets

APPARATUS AND METHOD FOR FABRICATION OF PRINTED CIRCUIT BOARDS

BACKGROUND OF THE INVENTION

1. Technical Field

The present invention relates to printed circuit boards. In particular, it relates to a method and apparatus for rapidly and inexpensively fabricating printed circuit boards using general purpose equipment such as a personal computer with an ordinary laser printer and without requiring any special equipment.

2. Background Art

The manufacture of printed circuit boards has traditionally involved special equipment. For example, a typical development process includes the steps of designing the land pattern for the circuit board, using the design to create a mask, manufacturing a printed circuit substrate with a surface conductive layer such as copper, coating the copper layer with a photoresist material, exposing the photoresist while masked, and etching the board to remove the copper in areas not masked. This procedure is not inconvenient during the mass production phase of a circuit.

On the other hand, the development of electronic circuitry has traditionally involved the fabrication of a small number of prototype boards to allow new circuit designs to be tested prior to entering the mass production stage. As a result, the special equipment and procedures required by the masking process often result in extended time delays since the board designs must be sent out from the design department to the department or outside company which has the specialized equipment. The time delays result in higher costs and delays in bringing products to market.

The prior art has made attempts to eliminate the need to use outside resources to fabricate test boards. For example, one known solution uses a special purpose printer to fabricate printed circuit boards with a personal computer. This approach uses a printer with a special solder ribbon. The computer deposits the solder directly onto a copper sheet. After the circuit design is printed onto the copper sheet in this manner, the solder acts as the mask during the etching step. While this method improves the turnaround time required to fabricate a board as compared to sending the board out for fabrication outside the department, the cost of fabricating boards in this manner is expensive due to the cost of the specialized printer and the solder ribbons. In addition, since the equipment is specialized in nature, there may be queuing delays if several individuals are waiting to access the printer at the same time.

A similar approach was used in the development of direct metal transfer to a substrate material. This approach eliminated the solder ribbon, but replaced it with a metal resistive ribbon which is selectively heated and brought into contact with the substrate to directly apply the circuit land pattern. As was the case in the foregoing example, this method requires special equipment which results in increased cost and potential queuing delays.

More recently, attempts have been made to use common equipment, such as the laser printer on an ordinary personal computer. A significant advantage of this approach is reduced cost since the printer will be available for other business tasks and not lay dormant when circuit boards are not required. One known method has been the use of laser printers to produce a mirror image of the land pattern on paper. The paper is then held in contact with the substrate and reheated. When the paper is sufficiently heated, the toner remelts and adheres to the substrate. This method eliminates the need for a special printer and is an improvement over the aforementioned prior art approaches. However, it does not eliminate the need for special equipment. To remelt the toner, a heater is required which adds to cost. In addition, the heater adds a new issue of safety due to the high temperature required to remelt the solder. A third drawback to this method is the degradation in precision each time the toner is melted. In circuit designs having finely drawn land patterns, breaks in the land pattern may result due to the second toner melt which may result ultimately in circuit failure. A fourth drawback to this method is that the paper actually fuses to the substrate along with the toner. As a result, the circuit board must be soaked in water to dissolve the paper after the second toner melting is complete. A design disadvantage to this method also occurs due to the fact that since the printed side of the paper must be placed against the substrate, the circuit must be printed in mirror image to allow the toner to be deposited correctly. Finally, this method also requires care and skill on the part of the user since successful toner transfer depends on precise control of three variables: heat, pressure, and time. As a result, misjudgment of any of these variables may result in defective boards and the further expense of duplicated effort to create a second or third board.

Another method, similar to the one discussed in the previous paragraph, uses a multilayer sheet which has a paper backing. In this method, the circuit is printed onto the non-paper portion of the sheet. The paper backing is peeled away and the sheet is placed in contact with the substrate. The sheet is then heated to remelt the toner. As was the case above, the toner is melted twice, which results in diminished resolution. Likewise, the image must be designed in reverse so that the land pattern will be formatted correctly after the second melt. The principle advantage of this method over the previously discussed method is that the sheet can be peeled from the substrate and does not have to be soaked in water.

While addressing various aspects of fabricating printed circuit boards, the prior art has typically provided solutions which require expensive special purpose equipment, require multiple toner melting steps with the resulting decrease in quality, require circuits to be designed in reverse image due to the multiple melting steps, and may not be capable of providing land patterns on both sides of a printed circuit board. The prior art has not provided a method of fabricating circuit boards which can be rapidly and easily designed, fabricated in-house with general purpose computer equipment, fabricated with a direct deposit of toner onto the conductive sheet, and not require heating equipment or multiple toner melting steps.

SUMMARY OF THE INVENTION

The present invention solves the foregoing problems by providing a laminated sheet which has a conductive layer, such as copper, attached to a nonconductive flexible substrate such as Kapton or Pyralux. The outer surface of the copper is coated with a toner retaining material which provides a receiving surface for toner when the laminated sheet is fed through a printer. The toner is deposited directly onto the laminated sheet in a single toner melting process. The other side of the flexible substrate is attached to a removable layer of paper which provides support for the laminated sheet during the printing process. The paper is removed after printing and the adhesive which held the paper is used to attach the flexible substrate to a rigid substrate. A solvent is used to remove the toner retaining material and expose the copper for etching. The solvent does not remove the toner which acts as a mask during the etching process. The toner can be removed after board fabrication with Xylene, a solvent, or with an abrasive pad such as steel wool.

DESCRIPTION OF THE PREFERRED EMBODIMENT

Prior to a discussion of the figures, a general overview of the invention disclosed herein will be presented. The apparatus and method used by this invention allows a circuit designer to fabricate a printed circuit board (hereinafter PCB) in a matter of a few minutes. By allowing PCBs to be fabricated this quickly, development time can be greatly accelerated by providing the engineer the ability to fabricate a PCB, test it, and then reiterate the process until the PCB design objectives have been met. This accelerated process eliminates the long delays found in many prior art approaches which required other departments in a company, or even outside vendors, to fabricate the PCB. The use of other departments or outside vendors was necessitated by the requirement for specialized equipment to manufacture the PCB.

This invention also allows the PCB to be manufactured with a single toner transfer on an ordinary laser printer. The expensive specialized printers and special purpose ribbon assemblies of the prior art are not required. In addition, by providing for direct toner transfer to the laminated sheet which forms the circuit board land pattern, the present invention eliminates the degradation in image quality which is inherent in prior art attempts to transfer toner images which are based on a second toner transfer. The degradation is caused by the flowing of toner each time it is melted. In the case of circuit designs which have narrow trace lines, the present invention also eliminates the potential for defective circuits due to breaks in the toner pattern caused by the second melting.

Other advantages over prior art laser circuit design techniques are the elimination of special heating equipment and the reduction in skill and precision required to fabricate PCBs using a multiple melt toner process. To remelt the toner for deposition on a conductive sheet, a heating device must be used to heat the paper holding the toner. The laminated sheet disclosed herein eliminates the need for specialized heating equipment entirely by transferring the toner directly onto the laminated sheet which holds the conductive layer. A further advantage of the present invention is that since a second toner melt heat transfer is not required, defects due to the use of incorrect temperature control are eliminated.

In addition to the drawbacks associated with the heat application required by a second toner melt, the resulting PCB quality is also effected by pressure. In a multiple toner melt system, the paper must be held in pressure contact with the PCB during the second toner melt heat transfer. If the applied pressure varies, the quality of the resulting PCB can be adversely effected. The direct transfer process of this invention eliminates pressure application as a factor in the fabrication step. In turn, quality is improved, along with overall yield rates.

A third factor improved upon by this invention is the elimination of the adverse effect of variances in time which occur in multiple toner melt methods. In addition to the heat and pressure factors, second melt toner methods require that the toner be remelted for a minimum amount of time. Removal of heat prior to the passage of sufficient time or exposure to heat for an excessive period of time may adversely effect the toner remelt, and consequently, the quality of the resulting PCB.

All three of the foregoing adverse factors, heat, pressure, and time, are eliminated by the direct print single melt method disclosed herein.

Figure 1:
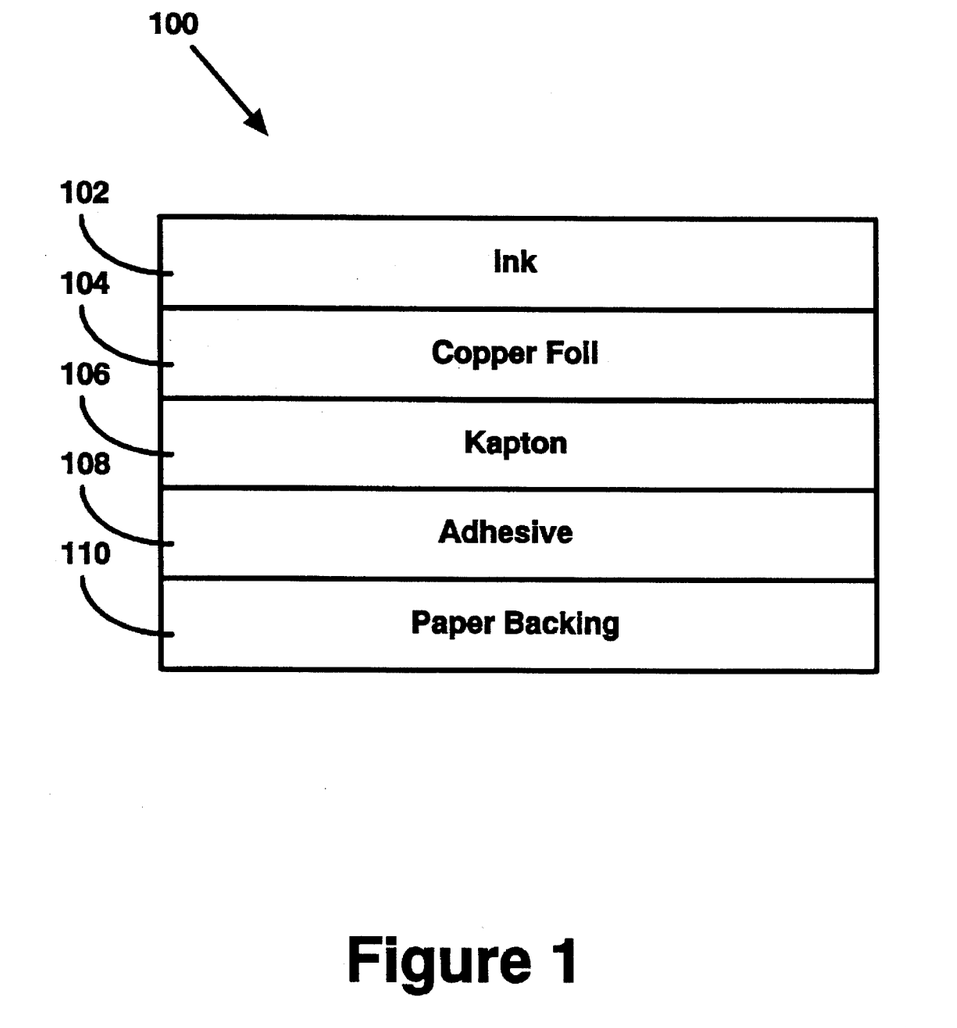
FIG. 1 is a diagram showing a side view of the laminated sheet and identifying each layer.

Referring to FIG. 1, this figure shows a side view of a laminated sheet 100 used for the manufacture of printed circuit boards using only a personal computer and an ordinary laser printer with no additional special equipment. For ease of illustration, the layers of the laminated sheet are shown as much thicker than they are to allow labelling. In practice, the laminated sheets 100 are typically sized to comfortably fit through the sheet feeder of a laser printer. The copper foil 104 which will eventually form the PCB land pattern is attached to a layer of flexible substrate material which in the preferred embodiment is a Kapton layer 106.

In the preferred embodiment ½ oz. copper is used. Those skilled in the art will recognize that the actual thickness of copper can vary so long as the resulting laminate is not too thick to properly feed through a laser printer, and in fact any number of suitable conductive materials can be substituted for copper. The use of a thinner gauge, such as ½ oz. is preferred over heavier gauges, such as 1 oz. because the etching time is faster for thinner copper laminates and the etchant lasts longer. The copper foil 104 can be attached to the surface of the Kapton 106 by adhesive (not shown) or by direct deposit. However, any suitable method of adhering the copper foil 104 to the Kapton 106 will suffice. Commercially available sheets of Kapton laminated with copper are available from Neptco Corporation (located in Pawtucket, R.I.). Copper/Kapton laminated sheets may be manufactured with thermoplastic high temperature polyester adhesives which are suitable for this purpose. Copper lamination techniques and the adhesives used for copper/Kapton lamination are well known in the art.

Kapton is available from DuPont Corporation. It was selected as the flexible substrate because it has superior ability to withstand soldering temperatures when components are assembled onto the completed PCB. Those skilled in the art will recognize that while Kapton is used in the preferred embodiment and for purposes of illustration, any suitable flexible substrate material can be used. For example, Pyralux, another product manufactured by DuPont Corporation can be substituted for Kapton.

To facilitate feeding the laminated sheet 100 through a printer and to provide a preapplied adhesive for adhering the laminated sheet 100 to the rigid substrate 302, an optional paper backing 110 is attached to the Kapton 106 by an adhesive layer 108. Thinner paper grades are preferred because they allow the other layers such as the copper foil 104 to be thicker. This is because the overall thickness possible is limited by the feed mechanism of the printer. Those skilled in the art will recognize that any suitable adhesive can be used so long as it allows removal of the paper backing 110 and can withstand the temperatures both in the printer and during later operations, such as soldering. Silicone based adhesives are preferred because they withstand higher temperatures. In addition, Acrylic based adhesives have also been found to be suitable. Both Silicone and Acrylic adhesives are well known in the art.

In the preferred embodiment, the optional paper backing 110 and the adhesive layer 108 are provided for convenience. Those skilled in the art will recognize that the paper backing 110 and the adhesive layer 108 can be eliminated. By so doing, the user would have to apply adhesive to the bottom surface of Kapton layer 106 or to the surface of the rigid substrate 302 to attach the laminated sheet 100 to the rigid substrate 302.

The top layer of laminated sheet 100 is an ink 102 which bonds to the copper foil 104 to form an upper layer suitable for retaining toner. When a circuit diagram is printed with toner on laminated sheet 100, ink 102 provides a suitable layer for retaining the toner which would otherwise not adhere effectively to copper foil 104. In the preferred embodiment a number 1250 white ink commercially available from Hitt Marking Devices (located in Santa Ana, Calif.) has been found to satisfactorily perform. An alternative ink manufactured by Dennison Corporation is also suitable.

Those skilled in the art will recognize that while the aforementioned ink is used in the preferred embodiment as a toner receiving material, any suitable material can be used so long as it is capable of being removably attached to the conductive layer 104 and is capable of having toner 202 printed on its surface. Therefore, the term "ink" is used herein for ease of discussion due to its use in the preferred embodiment, but the actual material used for a particular embodiment does not have to be "ink" per se, and may in fact be any material which can perform the aforedescribed function.

Figure 2A:
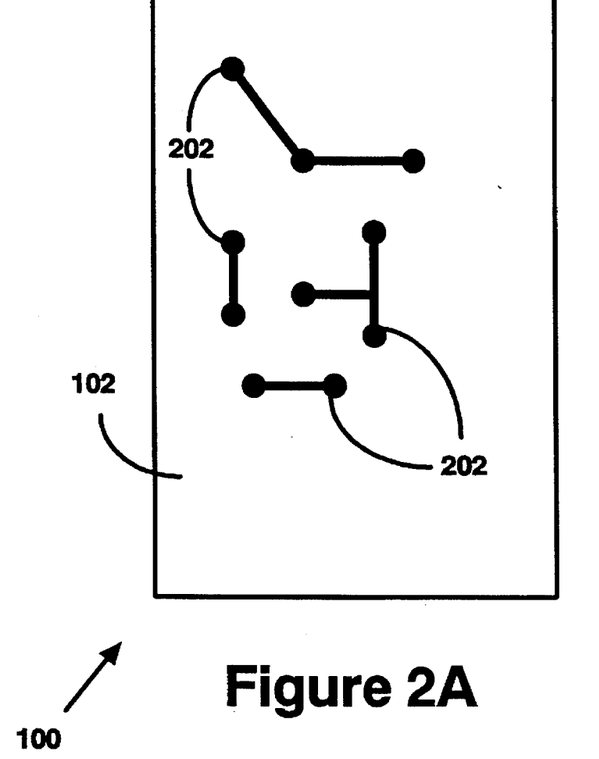
FIG. 2A is a diagram of showing a top view of a laminated sheet with a circuit design deposited with toner.
Figure 2B:
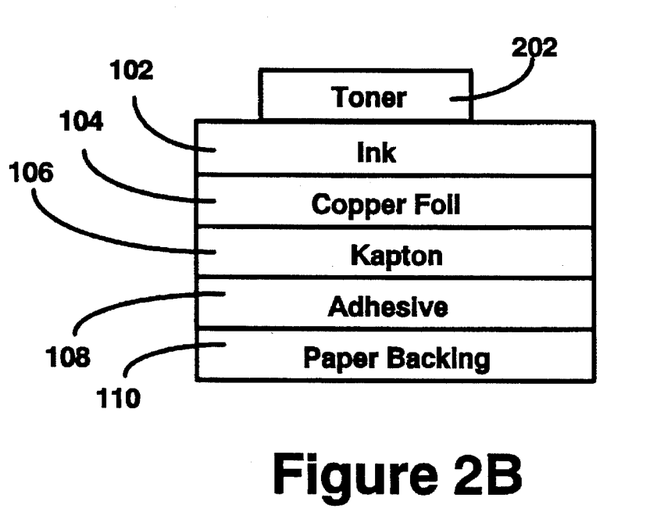
FIG. 2B is a diagram of the laminated sheet of FIG. 2A showing a side view of a laminated sheet with a circuit design deposited with toner.

FIG. 2A shows the top surface of laminated sheet 100 after toner 202 has been deposited on the surface of the ink 102 layer. FIG. 2B shows a side view of the laminated sheet of FIG. 2A which illustrates the laminated sheet 100 after printing.

Figure 3A:
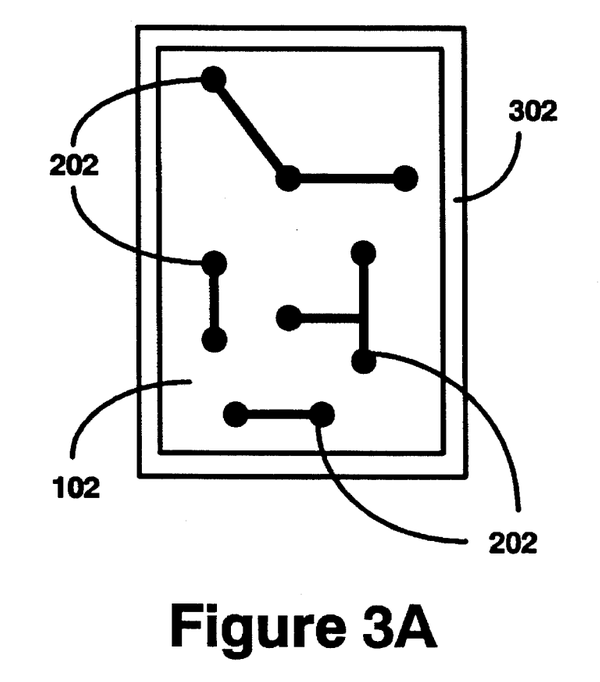
FIGS. 3A and 3B show the laminated sheet of FIGS. 2A and 2B after trimming and attachment to a rigid substrate.

FIG. 3A illustrates laminated sheet 100 of FIG. 2A after it has been attached to a rigid substrate 302 which will provide mechanical support for attachment of electrical components. The term "rigid" as used in reference to rigid substrate 302 is for ease of discussion and is actually a "supporting" substrate as it is referred to in the claims. Those skilled in the art will recognize that flexible substrates capable of supporting attachment of electrical components may also be used. Laminated sheet 100 is trimmed to allow use of a smaller rigid substrate 302 and to better fit the intended circuit pattern.

Figure 3B:
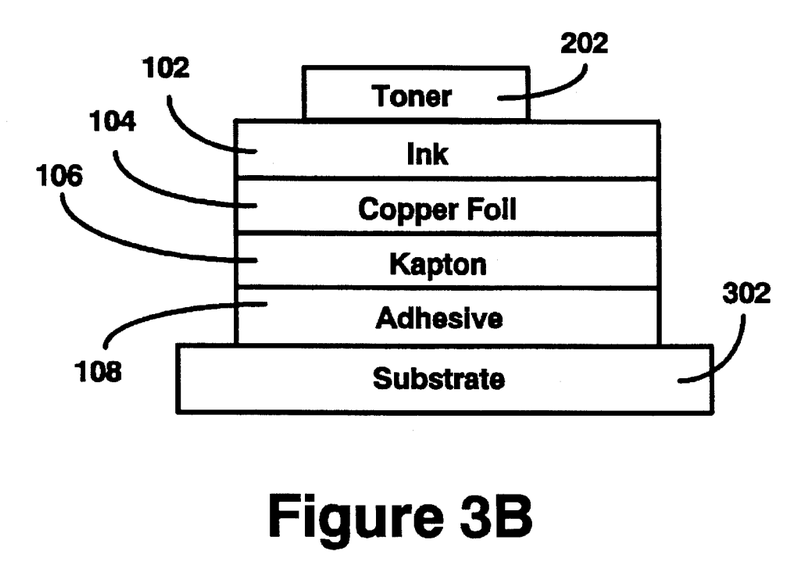

In FIG. 3B, the paper backing 110 is removed to allow adhesive 108 to be placed in pressure contact with substrate 302. For ease of illustration, rigid substrate 302 is shown extending past the edges of laminated sheet 100. However, there is no reason why laminated sheet 100 cannot be the same size as rigid substrate 302 as would be the case if laminated sheet 100 was attached to rigid substrate 306 and then trimmed. At this point a rigid non-etched, non-drilled PCB is complete.

Figure 4A:
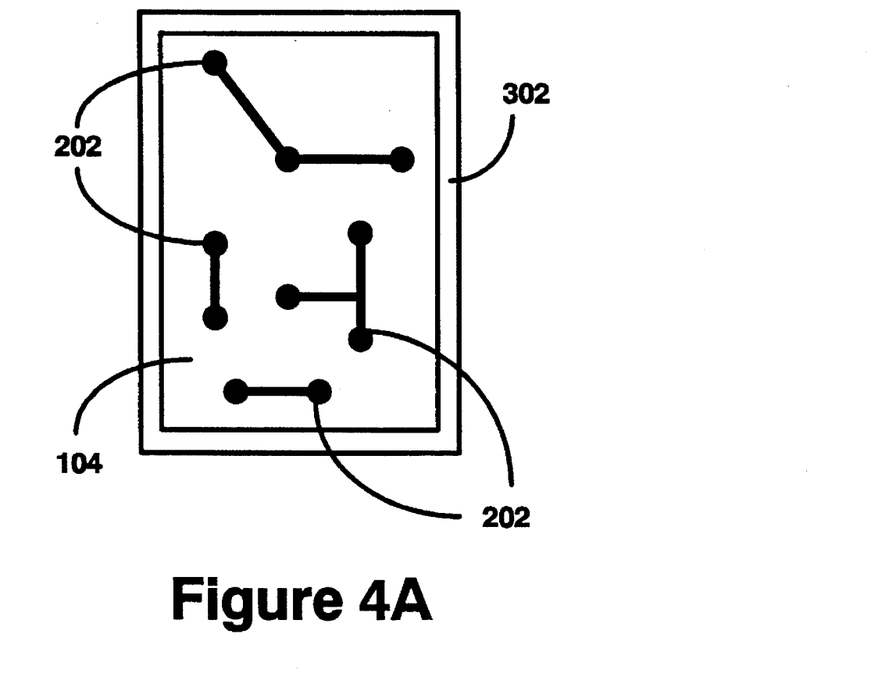
FIGS. 4A and 4B show the laminated sheet of FIGS. 3A and 3B after removal of the ink layer not covered by toner.
Figure 4B:
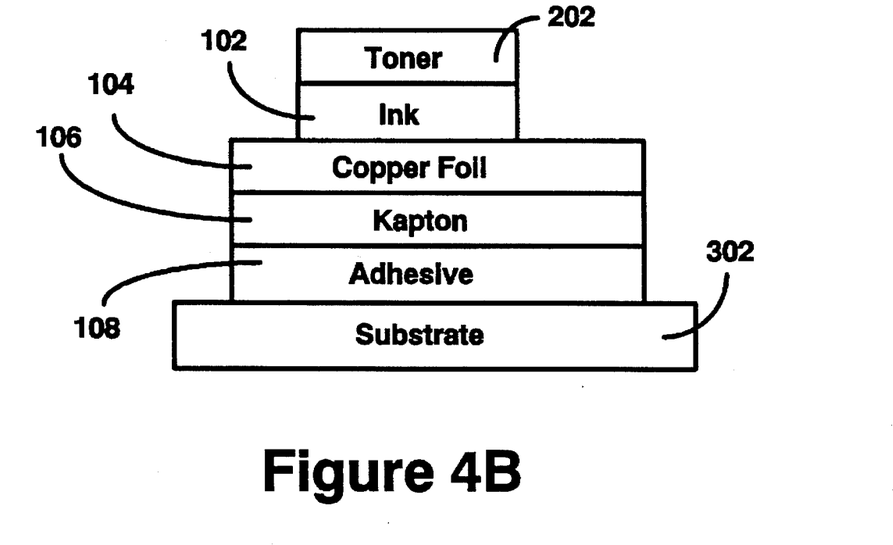

FIGS. 4A and 4B illustrate the next step in the process. Using an alcohol soaked gauze pad (not shown), the surface of the PCB is rubbed to remove the exposed ink 102. The alcohol does not remove the toner 202 which in turn prevents the alcohol from removing the ink 102 under toner 202. As a result of this process, the copper foil 104 is exposed for etching, except where it remains covered by toner 202 and ink 102. At this point, the PCB is ready for etching. Alcohol is used in the preferred embodiment because of its low cost, ready availability, and suitability for use with ink 102. However, any number of solvents may accomplish the same function as alcohol, and in fact a different solvent may be required if an incompatible "ink" is used.

Figure 5A:
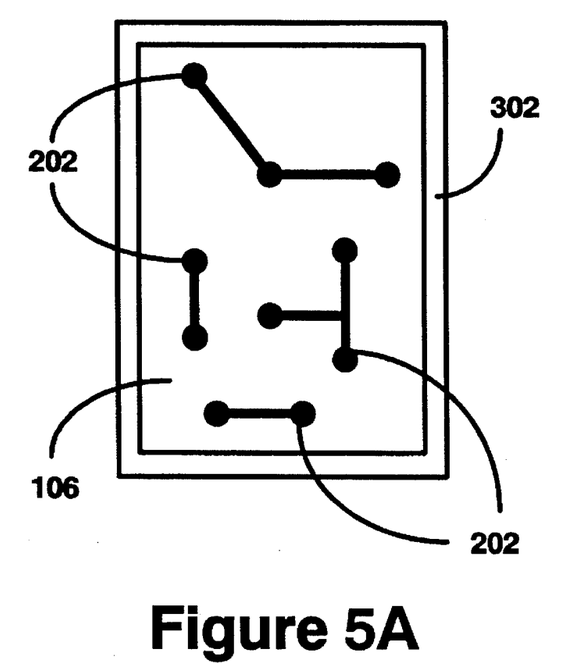
FIGS. 5A and 5B show the laminated sheet of FIGS. 4A and 4B after etching.
Figure 5B:
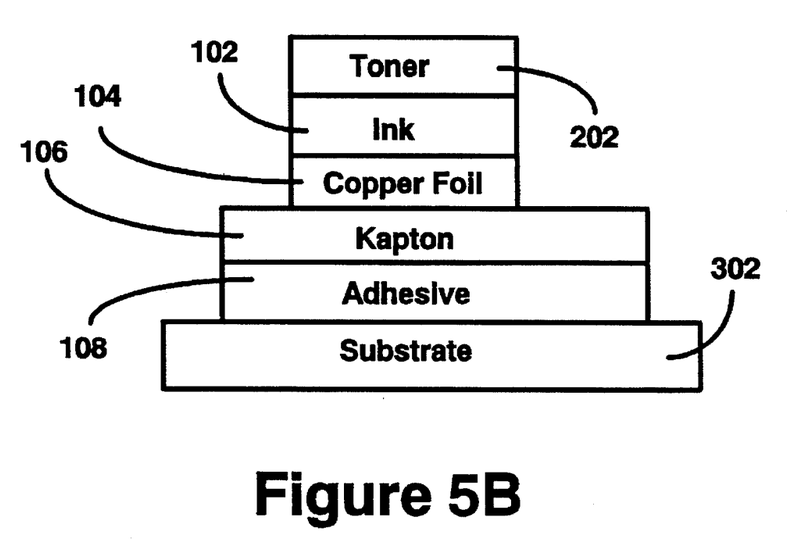

FIGS. 5A and 5B illustrate the result of the etching step. The copper foil 104 has been removed by the etchant where exposed. The portions of the copper foil 104 protected by the toner 202 and the ink 102 remain. Etching is well known in the art and will not be discussed in more detail herein. At this point, the PCB is now ready for the drilling stage.

Figure 6:
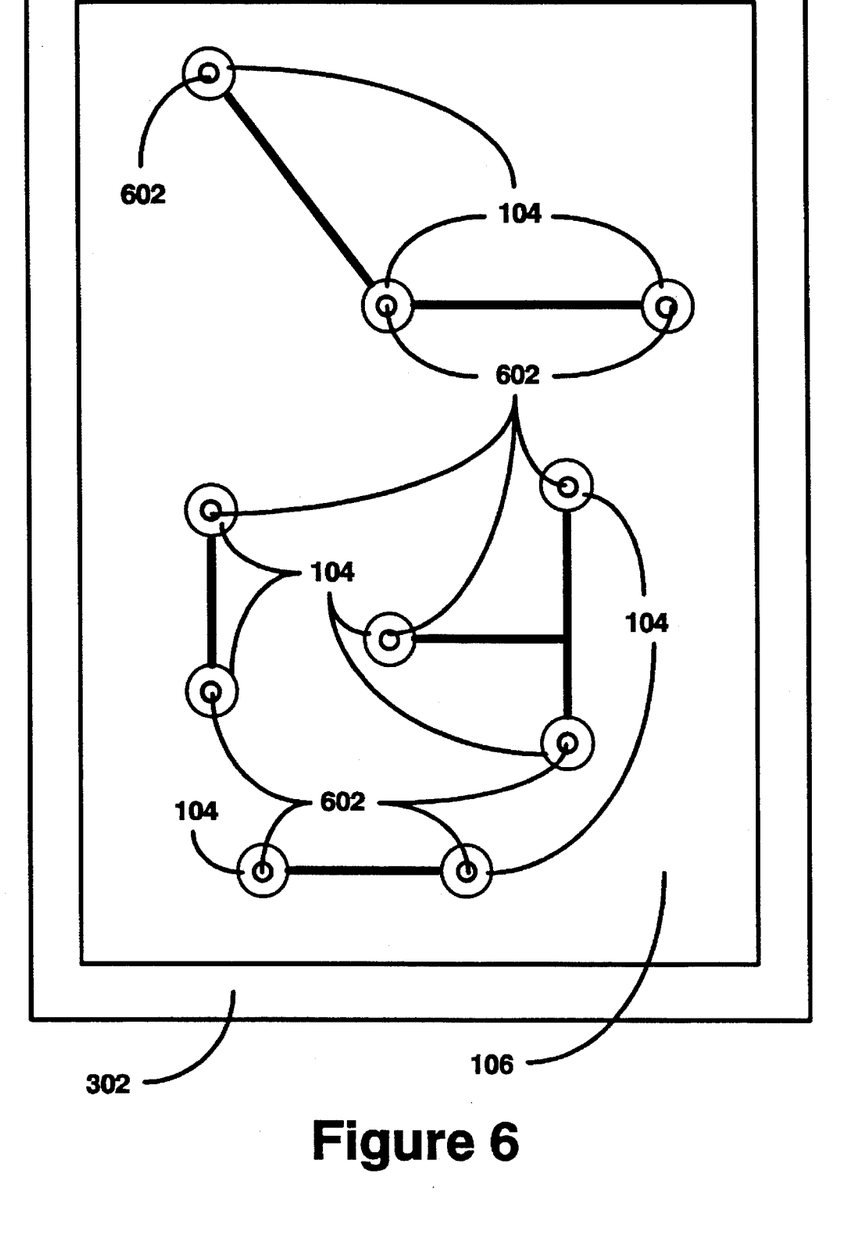
FIG. 6 is a top view of the laminated sheet after drilling.

FIG. 6 shows the PCB after drilling, Toner 202 and ink 102 are removed from copper foil 104 by rubbing with a solvent such as Xylene or with an abrasive such as steel wool. This results in a clean copper surface suitable for drilling and soldering. Holes 602 may now be drilled through the PCB at the appropriate placed in the PCB land pattern and components soldered thereto in the customary manner. It is preferable to remove the toner 202 prior to drilling to avoid leaving toner 202 in the drilled holes 602, and also to avoid weakening the land pattern prior to removing the toner 202.

As can be seen by the foregoing discussion, the circuit land pattern is printed onto the laminated sheet 100 with a single toner melt. This eliminates the requirement for special equipment. By using an ordinary laser printer in this manner, no additional equipment is required other than that used by personal computers for general purpose use. The single toner melt process disclosed herein also eliminates the image degradation which may result from the multiple toner melts used by known techniques.

Figure 7A:
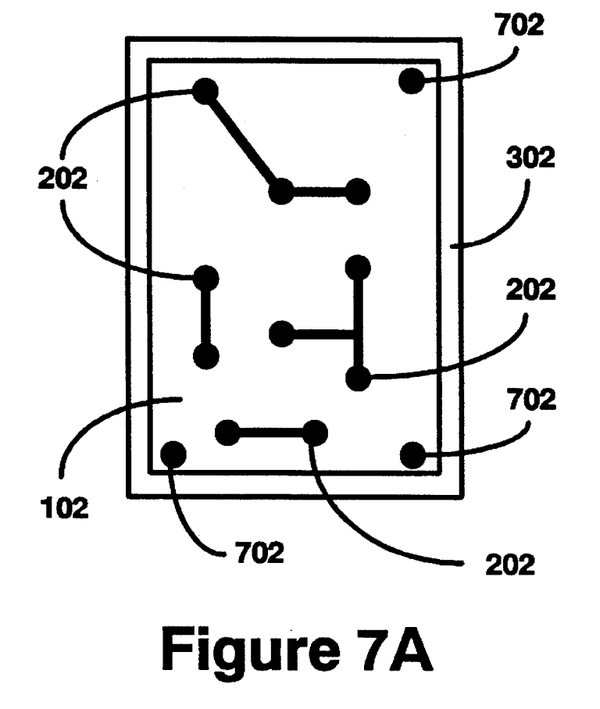
FIGS. 7A and 7B show top and side views of the laminated sheet with alignment apertures.
Figure 7B:
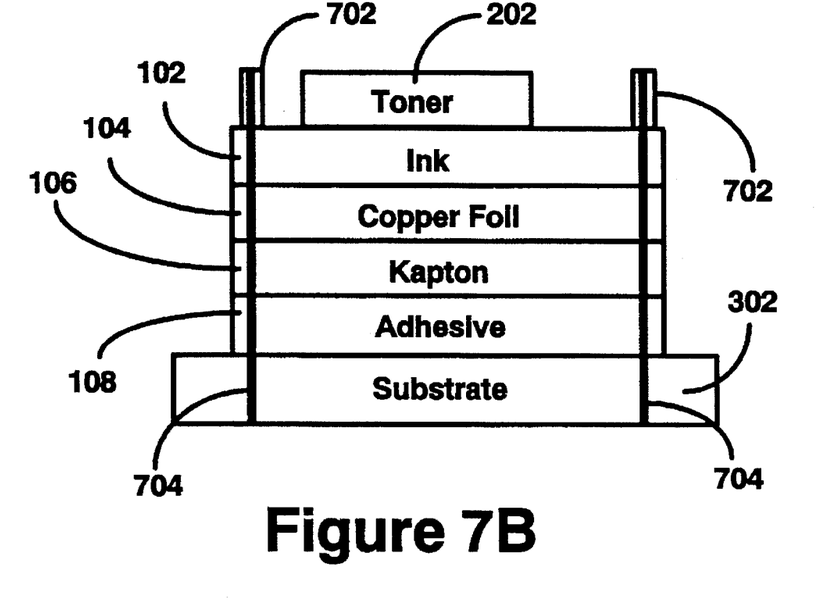
Figure 8:
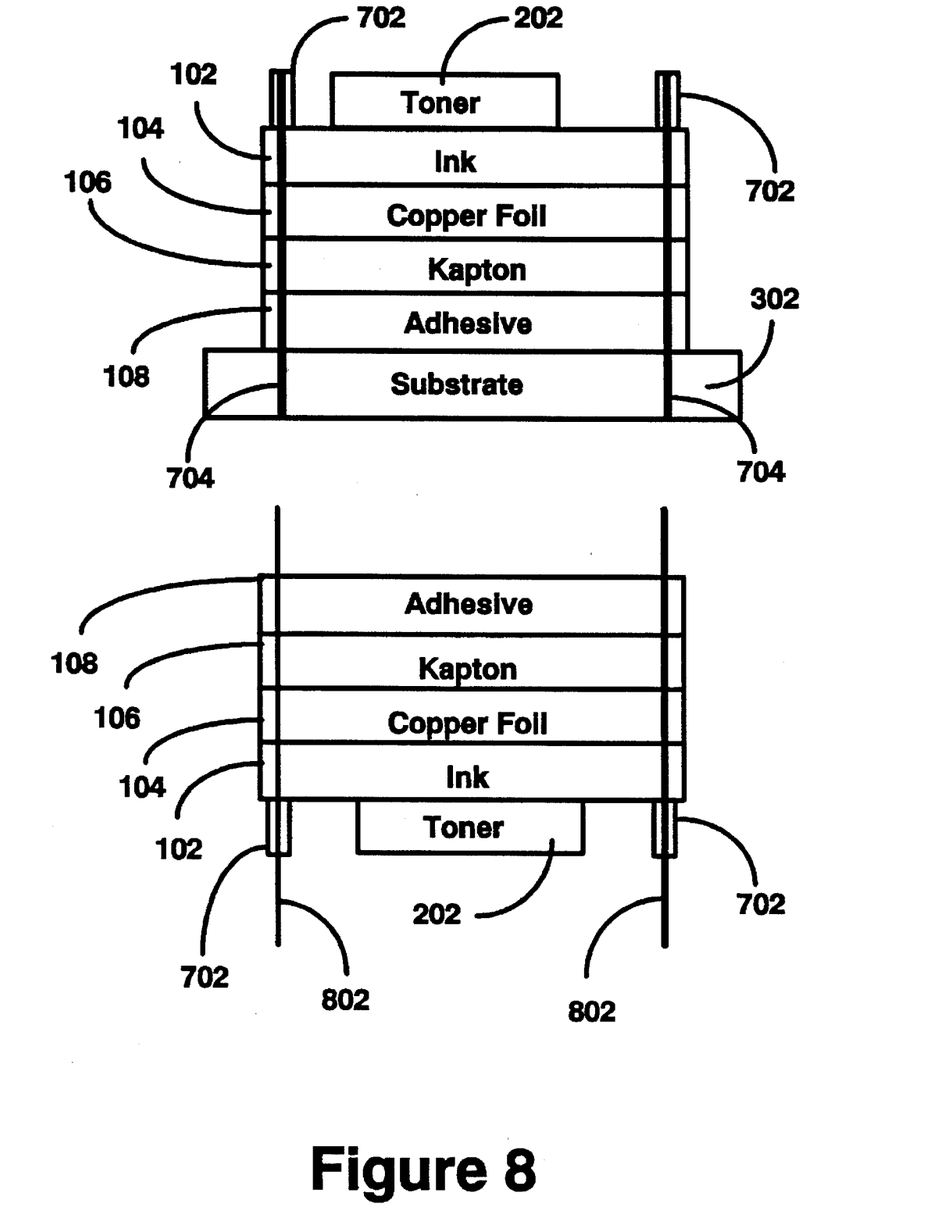
FIG. 8 shows a side view of the laminated sheet of FIGS. 7A and 7B with a second laminated sheet in position prior to mounting on the opposing side of the rigid substrate.
Figure 9:
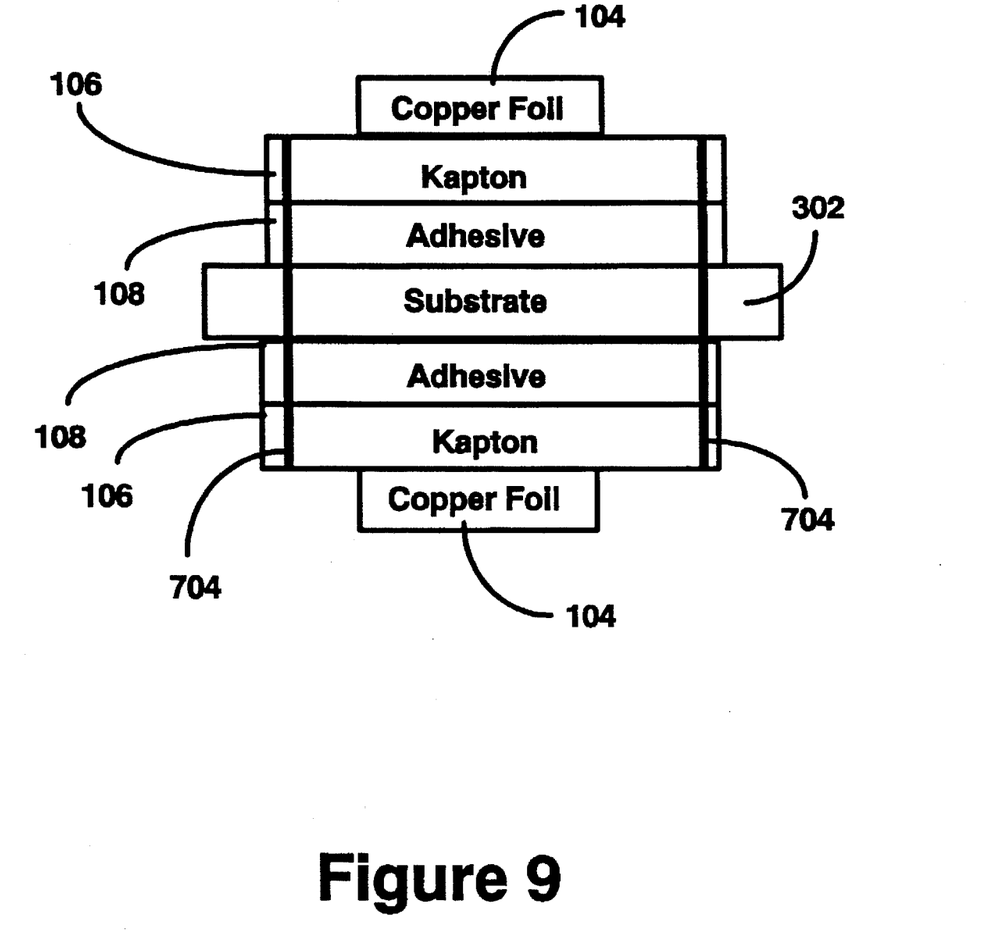
FIG. 9 shows a completed circuit board with land patterns attached to both sides of the rigid substrate.

FIGS. 7 through 9 illustrate the technique used to produce a double sided PCB using the instant invention.

In FIGS. 7A and 7B, an incomplete PCB similar to that discussed above in regard to FIGS. 3A and 3B is shown. The differences between the device of FIGS. 3A and 3B and the device of FIGS. 7A and 7B is as follows.

Alignment indicia 702 are printed at predetermined locations on laminated sheet 100. Laminated sheet 100 is then attached to rigid substrate 302 in the usual manner. Small apertures 704 are then drilled through the PCB.

In FIG. 8, a second laminated sheet 100 is printed with alignment indicia 702 which correspond to the alignment indicia 702 of the first laminated sheet 100. A needle 802 is used to poke holes through the center of the alignment indicia on the second laminated sheet 100 prior to removal of the paper backing 110. The paper backing 110 is then removed and needles 802 are placed through the holes in the alignment indicia 702. The needles 802 are inserted through second laminated sheet 100 and into apertures 704 such that adhesive 108 faces rigid substrate 302. Needles 802 act as guides to ensure that the second laminated sheet 100 is located at the correct position on rigid substrate 302. After second laminated substrate 100 is attached to rigid substrate 302, needles 802 are removed.

FIG. 9 shows a completed double sided PCB with laminated sheets 100 attached to both sides of rigid substrate 302. At this point, both sides may be processed in the same manner as a single sided PCB. The ink 102 may be removed from both sides with an alcohol soaked pad, the copper foil 104 partially removed by etching, the toner removed, and holes drilled at the appropriate locations.

As shown in FIGS. 7 through 9, the single toner melt method can be used to fabricate double sided boards as well as single sided boards. In addition, all of the advantages discussed in relation to single sided PCBs apply to double sided PCBs fabricated by this method.

While the invention has been described with respect to a preferred embodiment thereof, it will be understood by those skilled in the art that various changes in detail may be made therein without departing from the spirit, scope, and teaching of the invention. For example, a variety of compounds may be substituted for the ink used in the preferred embodiment, Kapton and Pyralux may be replaced with any suitable flexible substrate, any number of solvents may be used in place of alcohol, adhesives may be changed, a flexible substrate capable of supporting components can replace the rigid substrate which was used for illustration purposes, the optional paper backing can be eliminated along with the adhesive, etc. Accordingly, the invention herein disclosed is to be limited only as specified in the following claims.

I claim:

1. A laminated sheet for printing circuit board land patterns with a single toner melt, comprising:

an electrically conductive layer having a lower surface and an upper surface;

a nonconductive substrate having a lower surface and an upper surface, the upper surface of the nonconductive substrate attached to the lower surface of the electrically conductive layer; and a layer of toner retaining material, said toner retaining material capable of retaining toner directly deposited via laser printing and substantially covering the upper surface of the electrically conductive layer.

2. A laminated sheet, as in claim 1, wherein the toner retaining material is an ink.

3. A laminated sheet, as in claim 2, wherein the nonconductive substrate is a polyimide film.

4. A laminated sheet, as in claim 3, further comprising:

an adhesive layer, said adhesive layer substantially covering the lower surface of the nonconductive substrate; and a backing layer having a lower surface and an upper surface, said upper surface of the backing layer attached to the adhesive layer such that the backing layer is peelably adhered to the nonconductive substrate by the adhesive layer.

5. A laminated sheet, as in claim 4, wherein the adhesive layer is a silicone based adhesive.

6. A laminated sheet, as in claim 4, wherein the adhesive layer is an acrylic based adhesive.

\* \* \* \* \*